(12) United States Patent
Takashima et al.

(10) Patent No.: US 11,062,907 B2
(45) Date of Patent: Jul. 13, 2021

(54) NITRIDE SEMICONDUCTOR DEVICE

(71) Applicant: FUJI ELECTRIC CO., LTD., Kanagawa (JP)

(72) Inventors: Shinya Takashima, Hachioji (JP); Ryo Tanaka, Hino (JP); Yuta Fukushima, Hino (JP); Hideaki Teranishi, Hachioji (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/299,142

(22) Filed: Mar. 12, 2019

(65) Prior Publication Data
US 2019/0304788 A1 Oct. 3, 2019

(30) Foreign Application Priority Data

Apr. 2, 2018 (JP) .............................. JP2018-070733

(51) Int. Cl.
*H01L 21/265* (2006.01)
*H01L 29/06* (2006.01)
(Continued)

(52) U.S. Cl.
CPC .... *H01L 21/26546* (2013.01); *H01L 21/0254* (2013.01); *H01L 21/266* (2013.01);
(Continued)

(58) Field of Classification Search
CPC .............. H01L 29/32; H01L 21/26546; H01L 21/2656; H01L 29/2003; H01L 21/0254; H01L 21/266; H01L 29/0623; H01L 29/2004; H01L 29/207; H01L 29/7802; H01L 29/7811; H01L 29/7813; H01L 29/861; H01L 29/0615; H01L 29/66204; H01L 29/8611; H01L 29/0619; H01L 29/1095

See application file for complete search history.

(56) References Cited

U.S. PATENT DOCUMENTS

2017/0271148 A1* 9/2017 Takashima ........ H01L 21/02389

FOREIGN PATENT DOCUMENTS

JP 2003124515 A 4/2003

OTHER PUBLICATIONS

Takuya Oikawa et al., "Formation of definite GaN p-n junction by Mg-ion implantation to n⁻-GaN epitaxial layers grown on a high-quality free-standing GaN substrate", Nuclear Instruments and Methods in Physics Research Section B: Beam Interactions with Materials and Atoms, Dec. 15, 2015, vol. 365, Part A, pp. 168-170. (Article in Press pp. 1-3).

* cited by examiner

*Primary Examiner* — Hoang-Quan Ho

(57) ABSTRACT

A nitride semiconductor device is provide, the nitride semiconductor device including: an epitaxial layer; and an ion implantation layer that is provided on the epitaxial layer over a continuous depth range that extends over 100 nm or longer, and has a P type doping concentration equal to or higher than $1 \times 10^{17}$ cm$^{-3}$, wherein the ion implantation layer has a region with a crystal defect density equal to or lower than $1 \times 10^{16}$ cm$^{-3}$, the region being located in a range which is on an upper-surface-side of an interface between the epitaxial layer and the ion implantation layer, and is within 100 nm from the interface.

12 Claims, 13 Drawing Sheets

(51) Int. Cl.
  *H01L 29/20* (2006.01)
  *H01L 29/207* (2006.01)
  *H01L 29/32* (2006.01)
  *H01L 29/78* (2006.01)
  *H01L 21/02* (2006.01)
  *H01L 29/861* (2006.01)
  *H01L 21/266* (2006.01)
(52) U.S. Cl.
  CPC ...... *H01L 29/0623* (2013.01); *H01L 29/2003* (2013.01); *H01L 29/207* (2013.01); *H01L 29/32* (2013.01); *H01L 29/7802* (2013.01); *H01L 29/7811* (2013.01); *H01L 29/7813* (2013.01); *H01L 29/861* (2013.01)

NITRIDE SEMICONDUCTOR DEVICE

The contents of the following Japanese patent application(s) are incorporated herein by reference:
NO. 2018-070733 filed in JP on Apr. 2, 2018.

BACKGROUND

1. Technical Field

The present invention relates to a nitride semiconductor device.

2. Related Art

A nitride semiconductor device in which a P type region is provided by ion implantation has conventionally been known (see Patent Literature 1, and Non-Patent Literature 1, for example).
Patent Literature 1: Japanese Patent Application Publication No. 2003-124515
Non-Patent Literature 1: Takuya Oikawa, Yusuke Saijo, Shigeki Kato, Tomoyoshi Mishima, and Tohru Nakamura, "Formation of definite GaN p-n junction by Mg-ion implantation to n-GaN epitaxial layers grown on a high-quality free-standing GaN substrate," Nuclear Instruments and Methods in Physics Research Section B: Beam Interactions with Materials and Atoms, 15 Dec. 2015, Volume 365, Part A, Pages 168-170.

SUMMARY

A nitride semiconductor device preferably has a lowered crystal defect density in a P type region formed by ion implantation.

A first aspect of the present invention provides a nitride semiconductor device including: an epitaxial layer; and an ion implantation layer that is provided on the epitaxial layer over a continuous depth range that extends over 100 nm or longer, and has a P type doping concentration equal to or higher than $1\times10^7$ cm$^{-3}$, wherein the ion implantation layer has a region with a crystal defect density equal to or lower than $1\times10^{16}$ cm$^{-3}$, the region being located in a range which is on an upper-surface-side of an interface between the epitaxial layer and the ion implantation layer, and is within 100 nm from the interface.

The P type doping concentration of the ion implantation layer may be equal to or higher than $1\times10^{18}$ cm$^{-3}$.

The ion implantation layer may have a region with a crystal defect density equal to or lower than $1\times10^{15}$ cm$^{-3}$, the region being located in the range which is on the upper-surface-side of the interface between the epitaxial layer and the ion implantation layer, and is within 100 nm from the interface.

The ion implantation layer may have a region where a doping concentration of a P type dopant is uniform in a depth direction.

The epitaxial layer may be of N type
The nitride semiconductor device may include a PN junction having the epitaxial layer as an N type region and the ion implantation layer as a P type region.

A withstand voltage of the PN junction may be equal to or higher than 600 V.

The nitride semiconductor device may be a PN diode having the ion implantation layer as a P type region of the PN diode.

The nitride semiconductor device may be a vertical GaN MOSFET having the ion implantation layer as a P type well region.

The nitride semiconductor device may be a vertical GaN power device having the ion implantation layer as a P type region of a peripheral edge termination structure.

A second aspect of the present invention provides a nitride semiconductor device fabrication method including: forming an epitaxial layer; and forming an ion implantation layer that is provided on the epitaxial layer over a continuous depth range that extends over 100 nm or longer, and has a P type doping concentration equal to or higher than $1\times10^{17}$ cm$^{-3}$, wherein the ion implantation layer has a region with a crystal defect density equal to or lower than $1\times10^{16}$ cm$^{-3}$, the region being located in a range which is on the upper-surface-side of an interface between the epitaxial layer and the ion implantation layer, and is within 100 nm from the interface.

The forming the ion implantation layer may have ion-implanting a Group V element.

The forming the ion implantation layer may have: ion-implanting a P type dopant at multiple steps; and ion-implanting a Group V element at multiple steps.

The forming the ion implantation layer may have ion-implanting at least one of Mg, Ca, Zn, and Be.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

In the present specification, one side of the direction parallel to the depth direction of a semiconductor substrate is referred to as the upper side, and the other side is referred to as the lower side. Among two principal surfaces of a substrate, a layer or another member, one surface is referred to as the upper surface, and the other surface is referred to as the lower surface. The "upward", "downward", "front", and "rear" directions are not limited by the direction of gravity or the direction of attachment to a substrate or the like at the time of implementation of a semiconductor device.

In the present specification, layers and regions that are indicated as N type and P type layers and regions are where electrons or holes are the majority carriers, respectively. In addition, "+" and "−" as suffixes of N and P mean that layers or regions they modify have higher doping concentrations and lower doping concentrations, respectively, than layers and regions without those suffixes.

Figure 1:
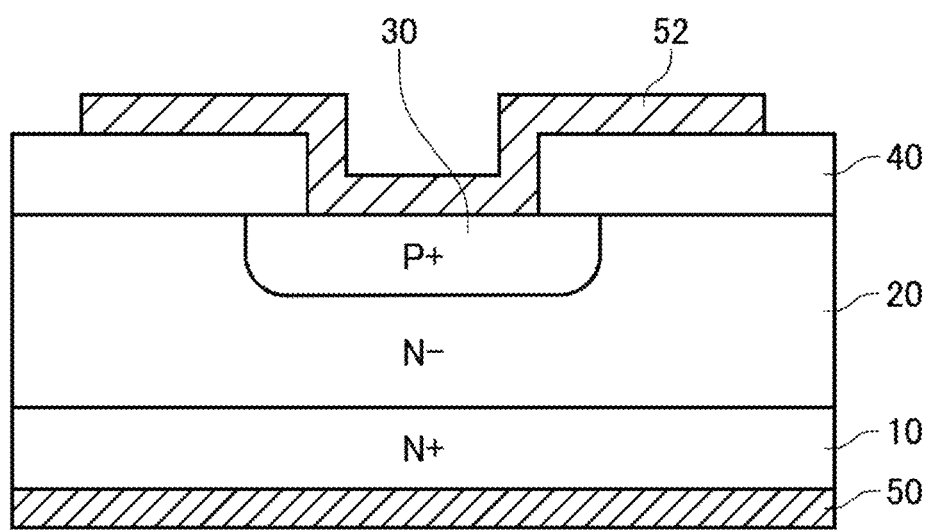
FIG. 1 illustrates an exemplary configuration of a nitride semiconductor device 100 according to a first embodiment.

FIG. 1 illustrates an exemplary configuration of a nitride semiconductor device 100 according to a first embodiment. The nitride semiconductor device 100 in the present example has a vertical PN diode structure. The nitride semiconductor device 100 includes a substrate 10, an epitaxial layer 20, an ion implantation layer 30, an insulation layer 40, a lower surface-side electrode 50 and an upper-surface-side electrode 52.

The substrate 10 is an N+ type self-standing GaN substrate. The substrate 10 may be prepared using a predetermined method such as vapor phase epitaxial growth such as HVPE, or liquid phase epitaxial growth. The substrate 10 may be cut out from an epitaxially grown GaN layer.

The epitaxial layer 20 is provided by being epitaxially grown on the substrate 10. For example, the epitaxial layer 20 is made of a material that can be epitaxially grown on the substrate 10 such as GaN. The epitaxial layer 20 may be of N type or of I type. I type means an intrinsic semiconductor with no dopants implanted therein. The epitaxial layer 20 in the present example is of N type. For example, the doping concentration of the epitaxial layer 20 is $1.5 \times 10^{16}$ cm$^{-3}$. Although not particularly limited, the thickness of the epitaxial layer 20 is 10 μm, for example.

The ion implantation layer 30 is provided on the epitaxial layer 20. The ion implantation layer 30 is provided by ion-implanting a dopant onto the epitaxial layer 20. The conductivity of the ion implantation layer 30 in the present example is P type. For example, the P type dopant is at least one of Mg, Ca, Zn, and Be. The epitaxial layer 20 and ion implantation layer 30 in the present example form a PN junction having the epitaxial layer 20 as an N type region, and the ion implantation layer 30 as a P type region.

The ion implantation layer 30 in the present example is provided selectively on the epitaxial layer 20. That the ion implantation layer 30 is provided selectively means that it is not provided over the entire upper surface of the epitaxial layer 20, but is provided on part of the upper surface. For example, the P type dopant is ion-implanted on the epitaxial layer 20 using a mask with a predetermined pattern.

The ion implantation layer 30 is provided over a continuous depth range that extends over 100 nm or longer. That is, the thickness of the ion implantation layer 30 is equal to or greater than 100 nm. On the other hand, the lateral size of the ion implantation layer 30 is not particularly limited as long as the ion implantation layer 30 is provided selectively. The lateral size means a size that is measured in a direction parallel to a principal plane of the substrate 10. By selectively providing the ion implantation layer 30, it can be applied to a P type region of the nitride semiconductor device 100 with no limitations imposed by a pattern.

The ion implantation layer 30 in the present example is provided by ion-implanting and annealing both the P type dopant and a Group V element as dopants. For example, the Group V element is at least one of nitrogen, phosphorus, and arsenic. The crystal defect density in the ion implantation layer 30 in the present example is lowered by ion-implanting the Group V element dopant, in addition to the P type dopant. In addition, the P type characteristics of the ion implantation layer 30 improve.

The doping concentration of the P type dopant in the ion implantation layer 30 may be equal to or lower than $1 \times 10^{19}$ cm$^{-3}$. The doping concentration of the P type dopant in the ion implantation layer 30 may be equal to or higher than $1 \times 10^{16}$ cm$^{-3}$, equal to or higher than $1 \times 10^{17}$ cm$^{-3}$, or equal to or higher than $1 \times 10^{18}$ cm$^{-3}$.

The doping concentration of the Group V element in the ion implantation layer 30 may be the same as the doping concentration of the P type dopant in the ion implantation layer 30. In addition, the doping concentration of the Group V element in the ion implantation layer 30 may be higher than the doping concentration of the P type dopant in the ion implantation layer 30. For example, the doping concentration of the Group V element in the ion implantation layer 30 may be 110%, 150%, 200%, or 300% of the doping concentration of the P type dopant in the ion implantation layer 30. Appropriately setting the doping concentration of the Group V element in the ion implantation layer 30 can improve the P type characteristics while at the same time lowering the crystal defect density in the ion implantation layer 30. Note that if the doping concentration of the Group V element is too low, the effects of ion-implanting the Group V element are not attained in some cases, and if the doping concentration of the Group V element is too high, the electrical characteristics deteriorate in some cases.

The crystal defect density in the ion implantation layer 30 may be equal to or lower than $1 \times 10^{16}$ cm$^{-3}$, or equal to or lower than $1 \times 10^{15}$ cm$^{-3}$. Lowering the crystal defect density in the ion implantation layer 30 lowers leakage current at the PN junction, and improves the PN junction withstand voltage. The withstand voltage of the PN junction of the nitride semiconductor device 100 may be equal to or higher than 600 V, 800 V, or 1000 V.

In this manner, a region in the ion implantation layer 30 where there are fewer crystal defects is provided also in a region near the interface between the epitaxial layer 20 and the ion implantation layer 30. For example, the region near the interface may mean a region located in a range which is on the upper-surface-side of the interface between the epitaxial layer 20 and the ion implantation layer 30 and is within 50 nm, 100 nm, 150 nm, or 200 nm from the interface. In addition, that there are fewer crystal defects in a region may mean that, in the region, the crystal defect density is equal to or lower than $1 \times 10^{16}$ cm$^{-3}$ or the crystal defect density is equal to or lower than $1 \times 10^{15}$ cm$^{-3}$.

The insulation layer 40 is provided on the upper surface of the epitaxial layer 20. The insulation layer 40 prevents electrical short-circuit between the upper-surface-side electrode 52 provided above the epitaxial layer 20 and the epitaxial layer 20. The insulation layer 40 has an opening above the ion implantation layer 30. For example, the insulation layer 40 is an oxide film such as a $SiO_2$ film.

The upper-surface-side electrode 52 is provided above the epitaxial layer 20. The upper-surface-side electrode 52 is provided on the upper surface of the insulation layer 40. The upper-surface-side electrode 52 is connected with the upper surface of the ion implantation layer 30 through the opening of the insulation layer 40. The upper-surface-side electrode 52 may be electrically connected with the ion implantation layer 30. For example, the upper-surface-side electrode 52 is a Ni/Au electrode. The upper-surface-side electrode 52 in the present example functions as the anode electrode of the PN diode.

The lower surface-side electrode 50 is provided under the lower surface of the substrate 10. The lower surface-side electrode 50 in the present example is provided under the entire lower surface of the substrate 10. For example, the lower surface-side electrode 50 is a Ti/Al electrode. The lower surface-side electrode 50 in the present example function as the cathode electrode of the PN diode.

In the nitride semiconductor device 100 in the present example, the P type ion implantation layer 30 can be formed selectively. Thereby, the ion implantation layer 30 can be used to form a device active region of a MOSFET or the like, or a peripheral region for maintaining a withstand voltage. On the other hand, it is difficult to form such a P type selective region by epitaxial growth. In the present example, a PN junction with excellent characteristics can be formed selectively by ion implantation.

In addition, in the nitride semiconductor device 100, the hole conductivity of the ion implantation layer 30 can be improved by ion implantation of the Group V element. Thereby, the dynamic performance of the nitride semiconductor device 100 as a switching device improves.

Figure 2:
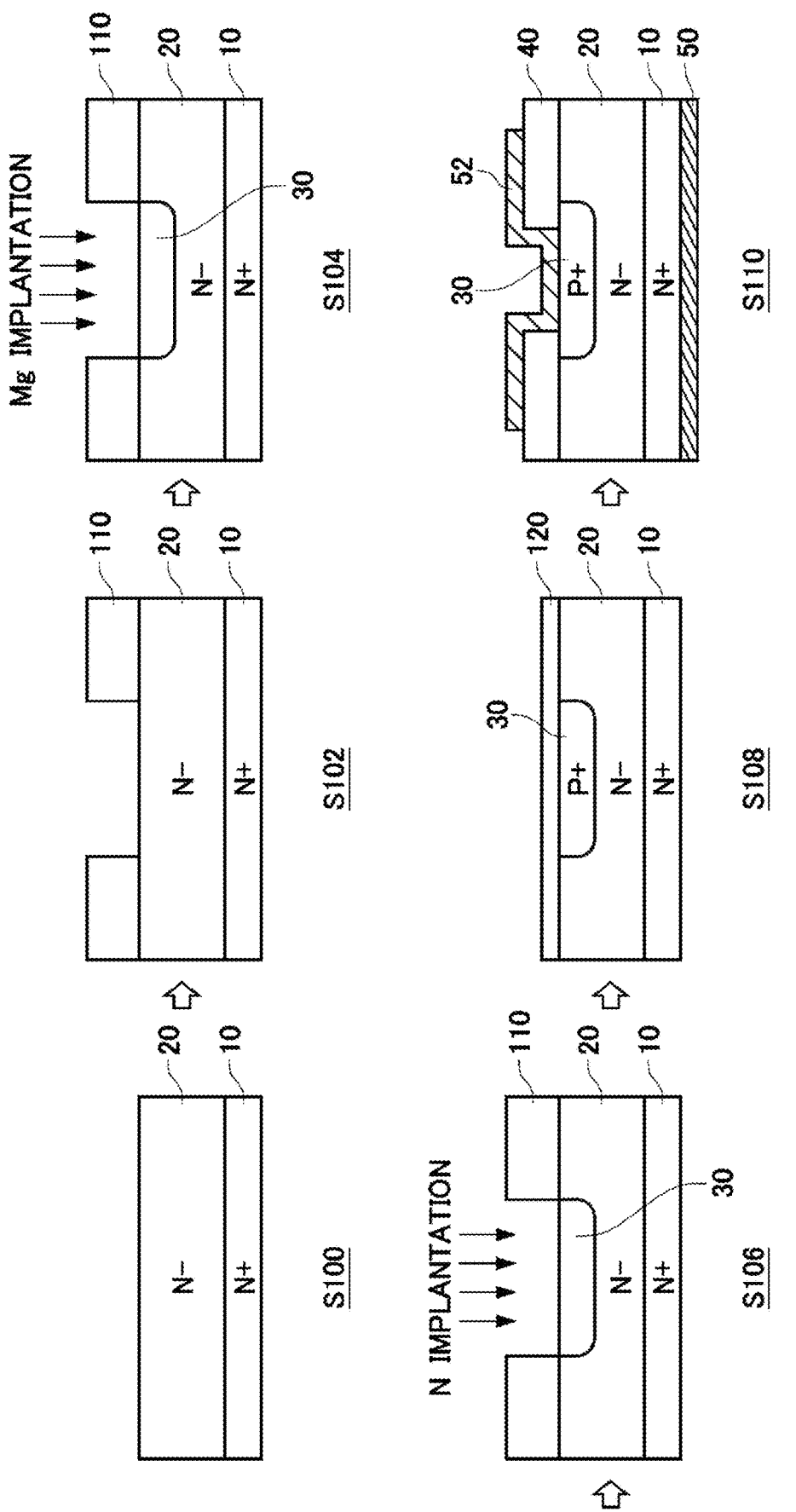
FIG. 2 illustrates an exemplary method of fabricating the nitride semiconductor device 100 according to the first embodiment.

FIG. 2 illustrates an exemplary method of fabricating the nitride semiconductor device 100 according to the first embodiment. The present example illustrates an exemplary method of fabricating the nitride semiconductor device 100, and this is not the only method.

The epitaxial layer 20 is formed on the substrate 10 (S100). The epitaxial layer 20 in the present example is epitaxially grown on the substrate 10 using a predetermined method such as MOCVD. The epitaxial layer 20 in the present example is an N type GaN layer having a film thickness of 10 μm, and a doping concentration of $1.5 \times 10^{16}$ $cm^{-3}$. Note that the film thickness and doping concentration of the epitaxial layer 20 are not limited to those indicated in the present example.

A mask 110 is formed on the epitaxial layer 20 (S102). The mask 110 limits ion implantation onto the epitaxial layer 20. The mask 110 has a pattern corresponding to a region where the ion implantation layer 30 is to be formed. Using the mask 110, the P type dopant is selectively implanted onto the region where the ion implantation layer 30 is to be formed (S104). The step of ion-implanting the P type dopant may include multiple ion implantation steps. By performing ion implantation at multiple steps, it becomes easier to adjust the depth by depth doping concentrations of the ion implantation layer 30. In the present specification, ion implantation at multiple steps means that a dopant is ion-implanted with varied implantation conditions about accelerating voltage or the like.

If ion implantation is performed at multiple steps, the accelerating voltage for ion-implanting the P type dopant may be changed step by step. By increasing the accelerating voltage for ion implantation, the P type dopant can be implanted deeper. In addition, the dosage may be set such that the doping concentration of the ion implantation layer 30 becomes uniform in the depth direction. For example, if Mg is ion-implanted at five steps, the accelerating voltage and dosage are set to: (240 keV, $2.60 \times 10^{13}$ $cm^{-2}$), (120 keV, $7.50 \times 10^{12}$ $cm^{-2}$), (60 keV, $4.00 \times 10^{12}$ $cm^{-2}$), (25 keV, $1.60 \times 10^{12}$ $cm^{-2}$), and (10 keV, $4.50 \times 10^{13}$ $cm^{-2}$).

Using the mask 110, the Group V element is ion-implanted as a dopant in the region where the ion implantation layer 30 is to be formed (S106). For example, the Group V element is at least one of nitrogen, phosphorus, and arsenic. The step of ion-implanting the Group V element may include multiple ion implantation steps. By ion-implanting the Group V element at multiple steps, it becomes possible to adjust the doping concentration of the Group V element in the depth direction according to the profile of the doping concentration of the P type dopant. The number of steps of the ion implantation of the Group V element may be the same as or different from the number of steps of the ion implantation of the P type dopant.

If ion implantation is performed at multiple steps, the accelerating voltage for ion-implanting the Group V element may be changed step by step. By increasing the accelerating voltage for ion implantation, the Group V element can be implanted deeper. For example, if nitrogen is ion-implanted at six steps, the accelerating voltage and dosage are set to: (180 keV, $5.50E \times 10^{13}$ $cm^{-2}$), (110 keV, $2.10 \times 10^{13}$ $cm^{-2}$), (70 keV, $1.10 \times 10^{13}$ $cm^{-2}$), (50 keV, $9.00 \times 10^{12}$ $cm^{-2}$), (30 keV, $7.00 \times 10^{12}$ $cm^2$), and (15 keV, $4.00 \times 10^{12}$ $cm^{-2}$), in the descending order of the depths.

The doping concentration of nitrogen is preferably about the same as the doping concentration of Mg. In particular, also in a region near the interface between the epitaxial layer 20 and the ion implantation layer 30, the doping concentrations of nitrogen and Mg are preferably about the same. Note that the order of the step of ion-implanting the P type dopant (S104) and the step of ion-implanting nitrogen (S106) may be reversed. That is, the Group V element may be ion-implanted first, and then the P type dopant may be ion-implanted.

Next, the mask 110 is removed, and the protective film 120 is formed on the epitaxial layer 20. Then, the nitride semiconductor device 100 is annealed (S108). The protective film 120 in the present example is a nitride film such as an AlN film. The nitride semiconductor device 100 is preferably thermally treated at high temperature such that crystal defects are reduced to a predetermined density or lower. By increasing the annealing temperature for the nitride semiconductor device 100, it becomes easier to lower the density of crystal defects generated by ion implantation of the P type dopant.

In one example, the nitride semiconductor device 100 is heated for five minutes at 1300° C. The annealing temperature for the nitride semiconductor device 100 may be equal to or higher than 1200° C., 1300° C., 1400° C., or 1500° C. The temperature, duration, pressure, or the like of annealing of the nitride semiconductor device 100 may be changed as appropriate depending on a material or the like of a protective film provided to the nitride semiconductor device 100, or the like. Note that, by annealing the nitride semiconductor device 100 in a high-pressure nitrogen atmosphere, it becomes easier to suppress dissociation of nitrogen.

Then, the protective film 120 is removed. On a surface from which the protective film 120 is removed, the insulation layer 40, lower surface-side electrode 50, and upper-surface-side electrode 52 are formed (S110).

For example, the insulation layer 40 is a silicon oxide film (SiO$_2$) with a film thickness of 400 nm. The upper-surface-side electrode 52 may be a film formed by stacking a Ni film and an Au film, and their film thicknesses may be 50 nm and 150 nm, respectively. The insulation layer 40 and the upper-surface-side electrode 52 are patterned. The lower surface-side electrode 50 may be a film formed by stacking a Ti film and an Al film, and their film thicknesses may be 20 nm and 200 nm, respectively. The lower surface-side electrode 50 may be provided under the entire lower surface of the substrate 10.

The ion implantation layer 30 in the present example is formed by ion implantation performed at multiple steps. Thereby, it becomes easier to adjust the doping concentration of the ion implantation layer 30 in the depth direction, and the doping concentration can be made uniform in the depth direction. Therefore, the doping concentrations of both the P type dopant and the Group V element are made uniform in the depth direction. Thereby, uniform P type characteristics and a uniform crystal defect density are attained in the ion implantation layer 30. The ion implantation layer 30 in the present example can lower the crystal defect density also in a region near its junction boundary with the epitaxial layer 20, while at the same time realizing excellent P type characteristics.

Note that the region where the Group V element is ion-implanted may be the same as or different from the region where the P type dopant is ion-implanted. By ion-implanting the Group V element and P type dopant in the same region, it becomes easier to lower the density of crystal defects generated by the ion implantation of the P type dopant. Note that as far as the Group V element is implanted in a region near the region where the P type dopant is implanted, the regions where the Group V element and the P type dopant are ion-implanted need not be the same.

Figure 3:
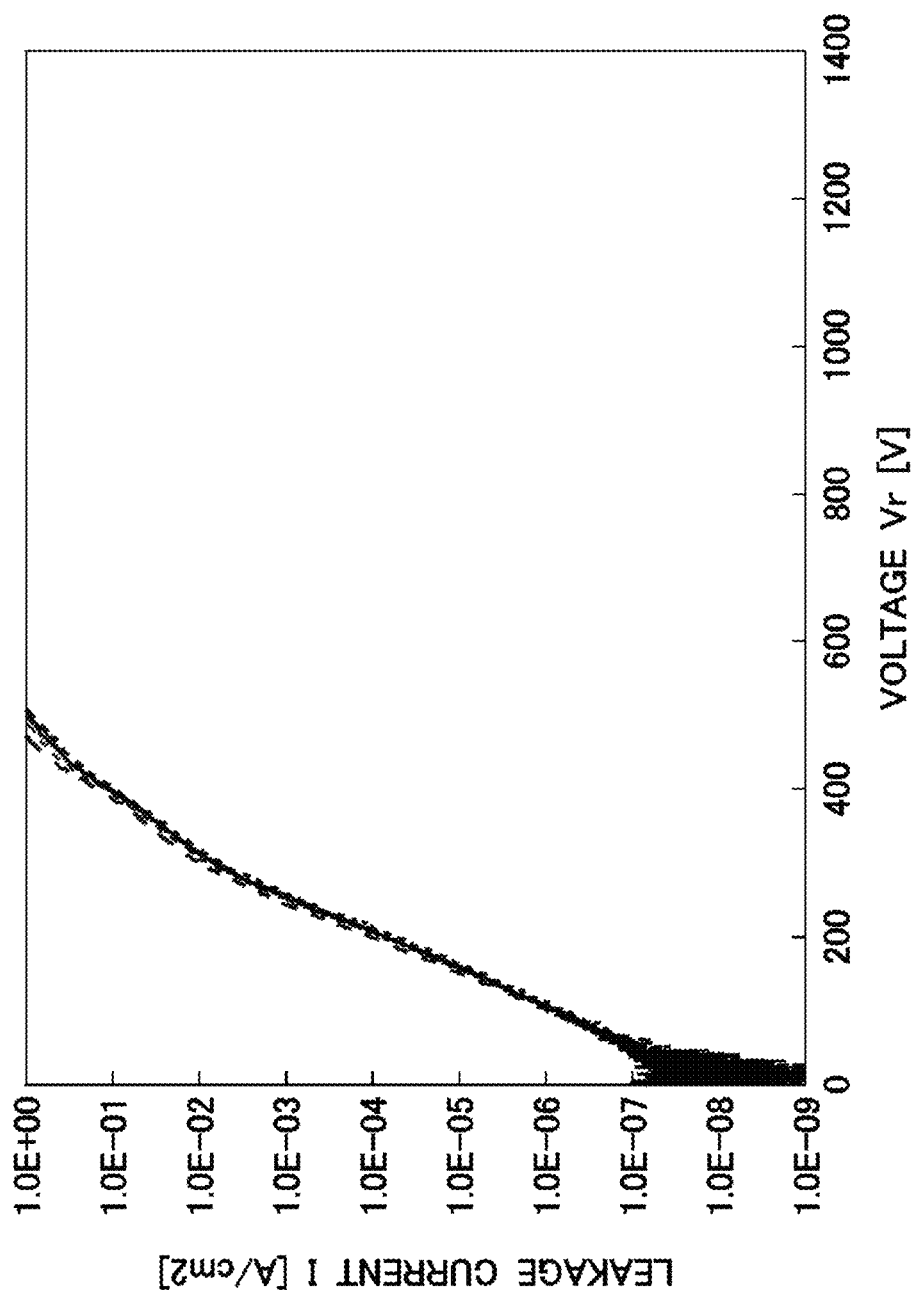
FIG. 3 illustrates an exemplary PN junction leakage of a nitride semiconductor device 500 according to a comparative example.

FIG. 3 illustrates an exemplary PN junction leakage of a nitride semiconductor device 500 according to a comparative example. The vertical axis indicates leakage current I [A/cm$^2$], and the horizontal axis indicates voltage Vr [V]. The voltage Vr represents reverse voltage applied across the PN junction of the nitride semiconductor device 500.

The nitride semiconductor device 500 has a PN junction which is a P type region formed by ion implantation. Note that although a P type dopant is ion-implanted in the P type region, a Group V element is not ion-implanted therein. Here, if the P type region is formed by ion implantation, nitrogen atoms are flicked off between lattice patterns in some cases. In this case, crystal defects are generated in a region where ions are implanted. If crystal defects are generated, leakage current at the PN junction increases, and this causes lowering of the withstand voltage.

Since, in the nitride semiconductor device 500 in the present example does not have an ion-implanted Group V element, the crystal defect density in the P type region cannot be lowered sufficiently. Therefore, it is difficult in the nitride semiconductor device 500 to reduce leakage current at the PN junction, and lowering of the withstand voltage cannot be suppressed. Leakage current of the nitride semiconductor device 500 in the present example increases at voltage Vr equal to or lower than 500 V. That is, the withstand voltage of the nitride semiconductor device 500 is equal to or lower than 500 V.

Figure 4:
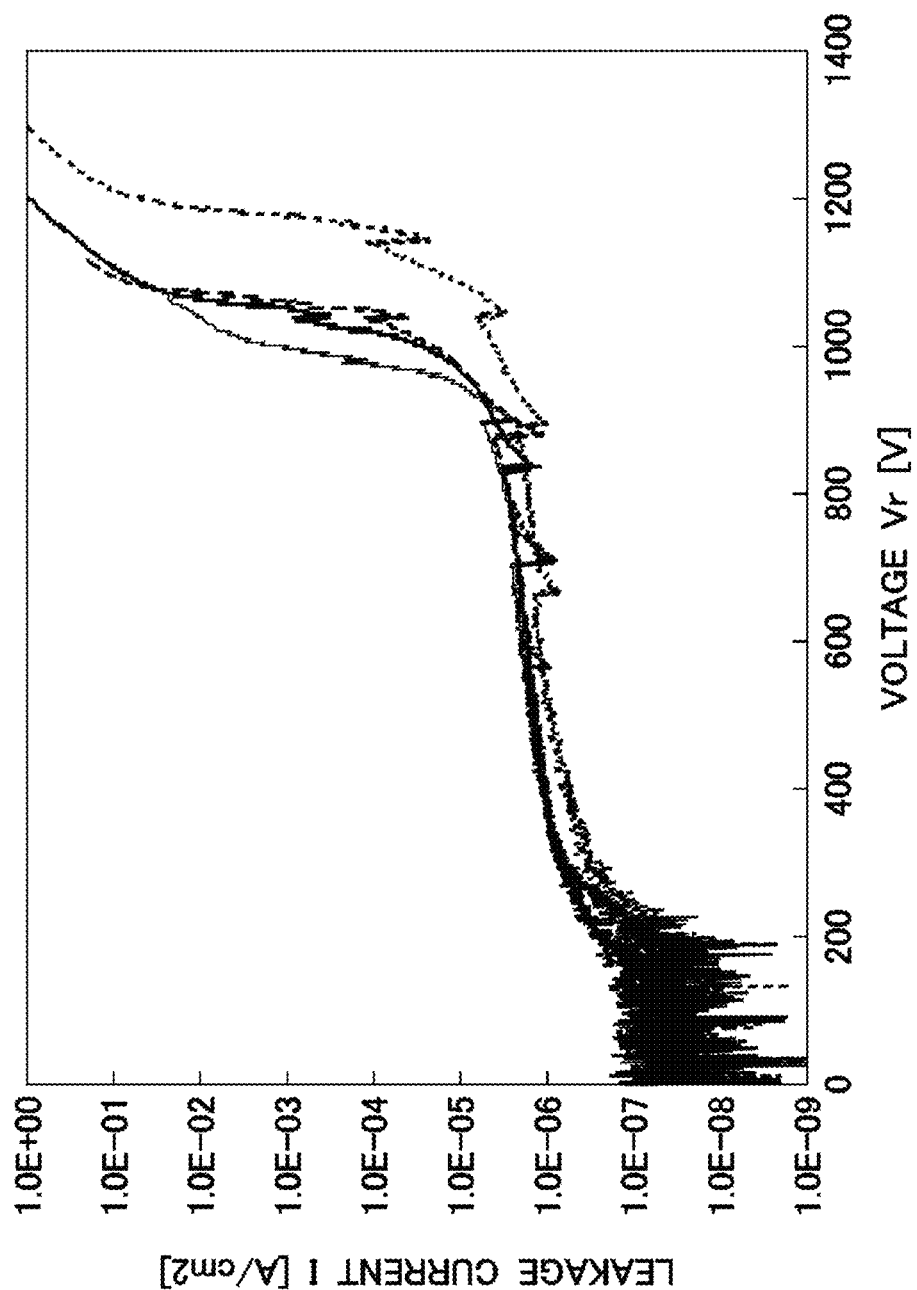
FIG. 4 illustrates an exemplary PN junction leakage of the nitride semiconductor device 100 according to FIG. 1.

FIG. 4 illustrates an exemplary PN junction leakage of the nitride semiconductor device 100 according to FIG. 1. The vertical axis indicates leakage current I [A/cm$^2$], and the horizontal axis indicates voltage Vr [V]. The nitride semiconductor device 100 in the present example has a withstand voltage equal to or higher than 1000 V. The voltage Vr represents a reverse voltage applied across the PN junction of the nitride semiconductor device 100.

In the nitride semiconductor device 100, crystal defects generated by ion implantation of the P type dopant are extinguished by ion-implanting and annealing the Group V element in addition to the P type dopant. Thereby, the withstand voltage of the PN junction formed by the ion implantation layer 30 as the P type region can be improved.

In the nitride semiconductor device 100 in the present example, even if the ion implantation layer 30 formed by ion implantation is used as the P type region, the withstand voltage of the PN junction can be improved. In addition, if the P type region is formed by ion implantation, a pattern can be freely selected for the P type region. Therefore, the ion implantation layer 30 can also be used also if a withstand voltage is required for the P type region, or if the P type region needs to be formed in a predetermined pattern. Therefore, the nitride semiconductor device 100 in the present example can be applied to various structures such as diodes, MOSFETs, or peripheral edge termination structures.

Note that it is conceivable to lower the crystal defect density, and improve the withstand voltage not by ion implantation, but by implanting a P type dopant at the time of epitaxial growth. However, it is difficult in a method of forming the P type region by epitaxial growth to selectively form the P type region. Therefore, it is difficult to apply the P type region formed by epitaxial growth to various structures such as diodes, MOSFETs, or peripheral edge termination structures.

Figure 5A:
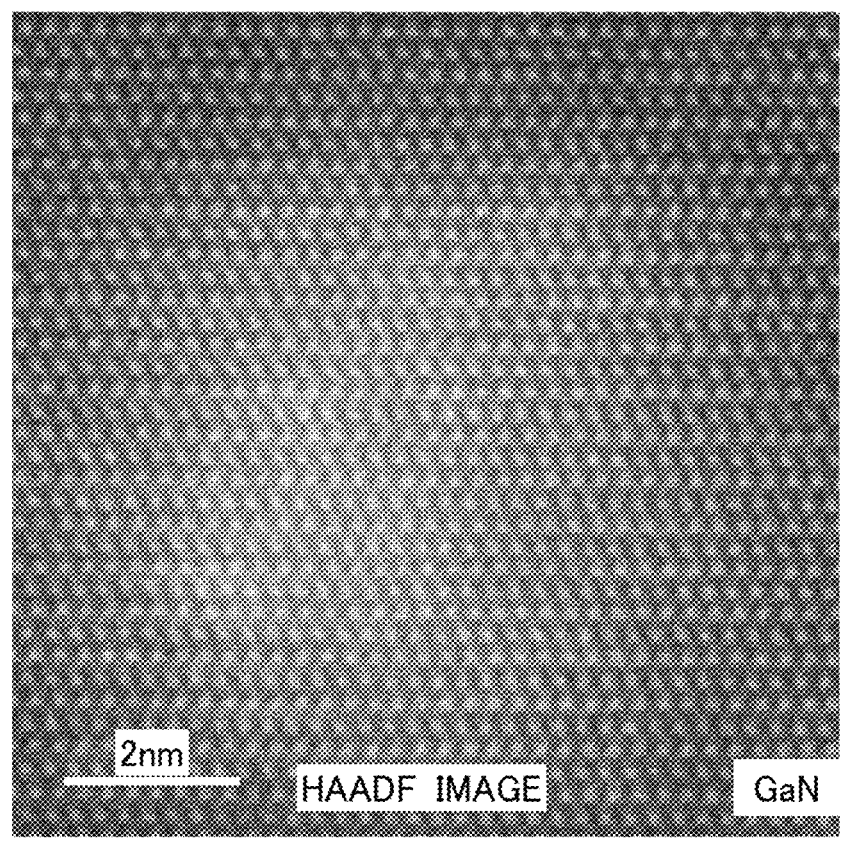
FIG. 5A illustrates an exemplary HAADF image of the nitride semiconductor device 100 according to the embodiment.

FIG. 5A illustrates an exemplary HAADF image of the nitride semiconductor device 100 according to the embodiment. The figure illustrates an example of observation of crystal defects in the ion implantation layer 30. The HAADF (High-angle Annular Dark Field) image was captured by scanning and irradiating a sample with an electron beam, and detecting, with an annular detector, electrons that are among electrons transmitted through the sample and are scattered at high angles.

Figure 5B:
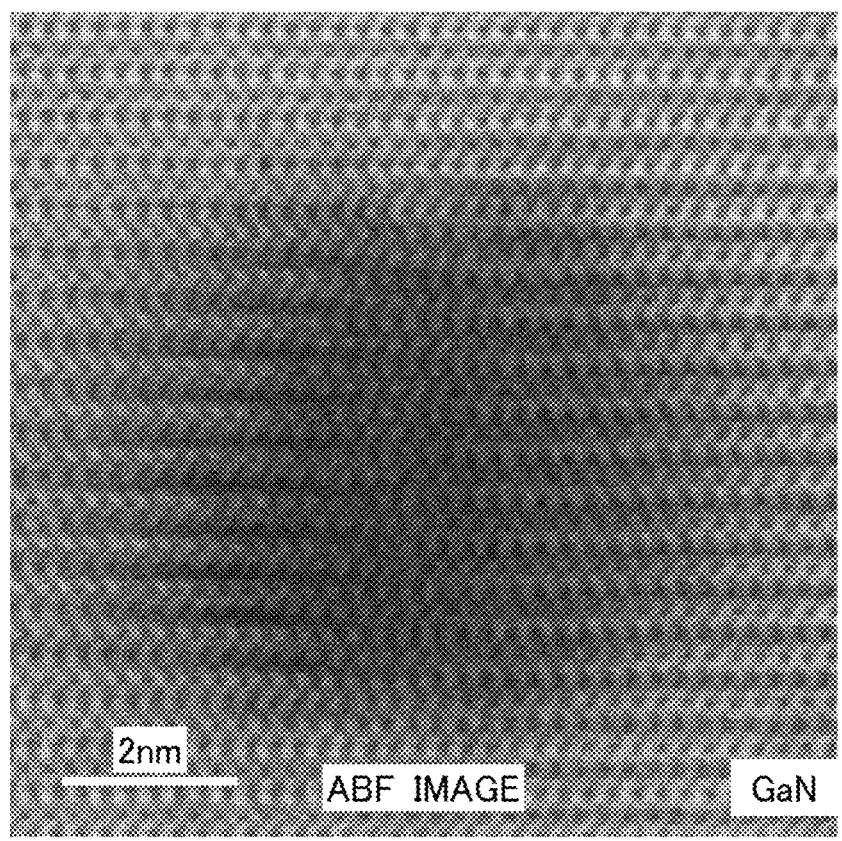
FIG. 5B illustrates an exemplary ABF image of the nitride semiconductor device 100 according to the embodiment.

FIG. 5B illustrates an exemplary ABF image of the nitride semiconductor device 100 according to the embodiment. The annular bright field (ABF: Annular Bright-Field) image was captured by scanning and irradiating a sample with an electron beam, and detecting, with an annular detector, electrons that are among electrons transmitted through the sample and are scattered at low angles.

FIG. 5A and FIG. 5B illustrate cross-sectional STEM images of the ion implantation layer 30. The observation conditions were: accelerating voltage=60 kV; observation magnification=×20M; and observation direction=<1-20>. The crystal defects of the nitride semiconductor device 100 do not mean threading dislocations which are crystal defects threading from the substrate 10 toward a surface, but mean locations in the ion implantation layer 30 where there is local misalignment of crystals. In the present example, a good GaN crystal image with no prominent crystal defects was observed.

Figure 6:
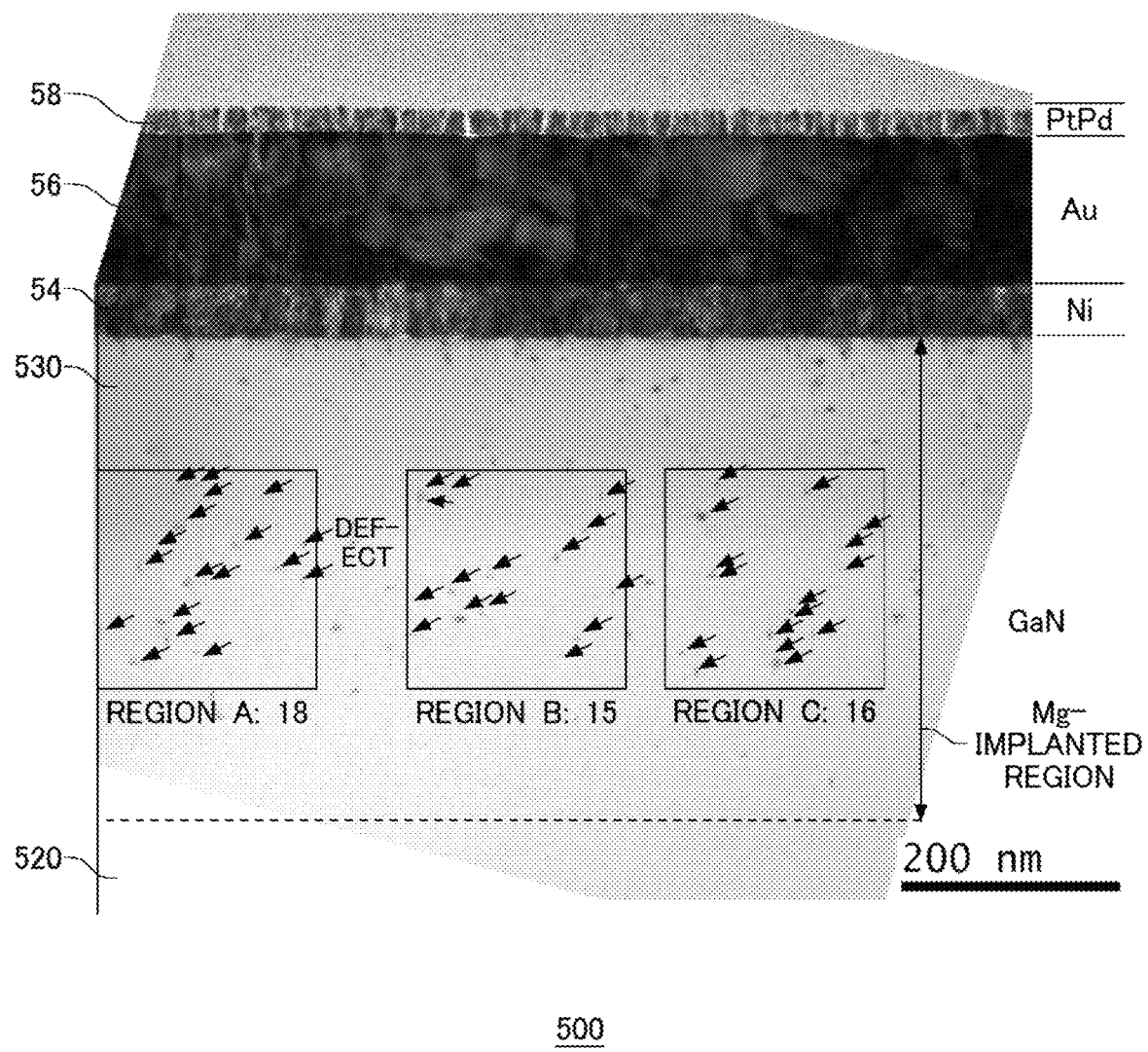
FIG. 6 is an exemplary cross-sectional TEM image illustrating the crystal defect density in an ion implantation layer 530 according to the comparative example.

FIG. 6 is an exemplary cross-sectional TEM image illustrating the crystal defect density in an ion implantation layer 530 according to the comparative example. The present example illustrates a cross-sectional TEM image of a region near a surface of the ion implantation layer 530 provided on an epitaxial layer 520. In one example, the observation conditions of the TEM image were: accelerating voltage=200 kV; observation magnification=×50,000; and observation direction=<1-20>. The region A to region C correspond to 200-nm square regions in a cross-section of the nitride semiconductor device 500. The region A to region C are different regions provided at the same depth.

Only Mg is ion-implanted in the ion implantation layer 530, and nitrogen is not ion-implanted therein. Therefore, the crystal defect density in the ion implantation layer 530 is not sufficiently lowered by annealing. A Ni layer 54 and an Au layer 56 are stacked on the ion implantation layer 530. A PtPd layer 58 is a layer provided for making it sure that there is conductivity for TEM observation.

The region A has 18 crystal defects in the 200-nm square region. The region B has 15 crystal defects in the 200-nm square region. The region C has 16 crystal defects in the 200-nm square region. In this manner, there are about 15 to 20 crystal defects in each 200-nm square region in the present example. In this case, the nitride semiconductor device 500 has a crystal defect density higher than $1 \times 10^{16}$ $cm^3$.

Figure 7:
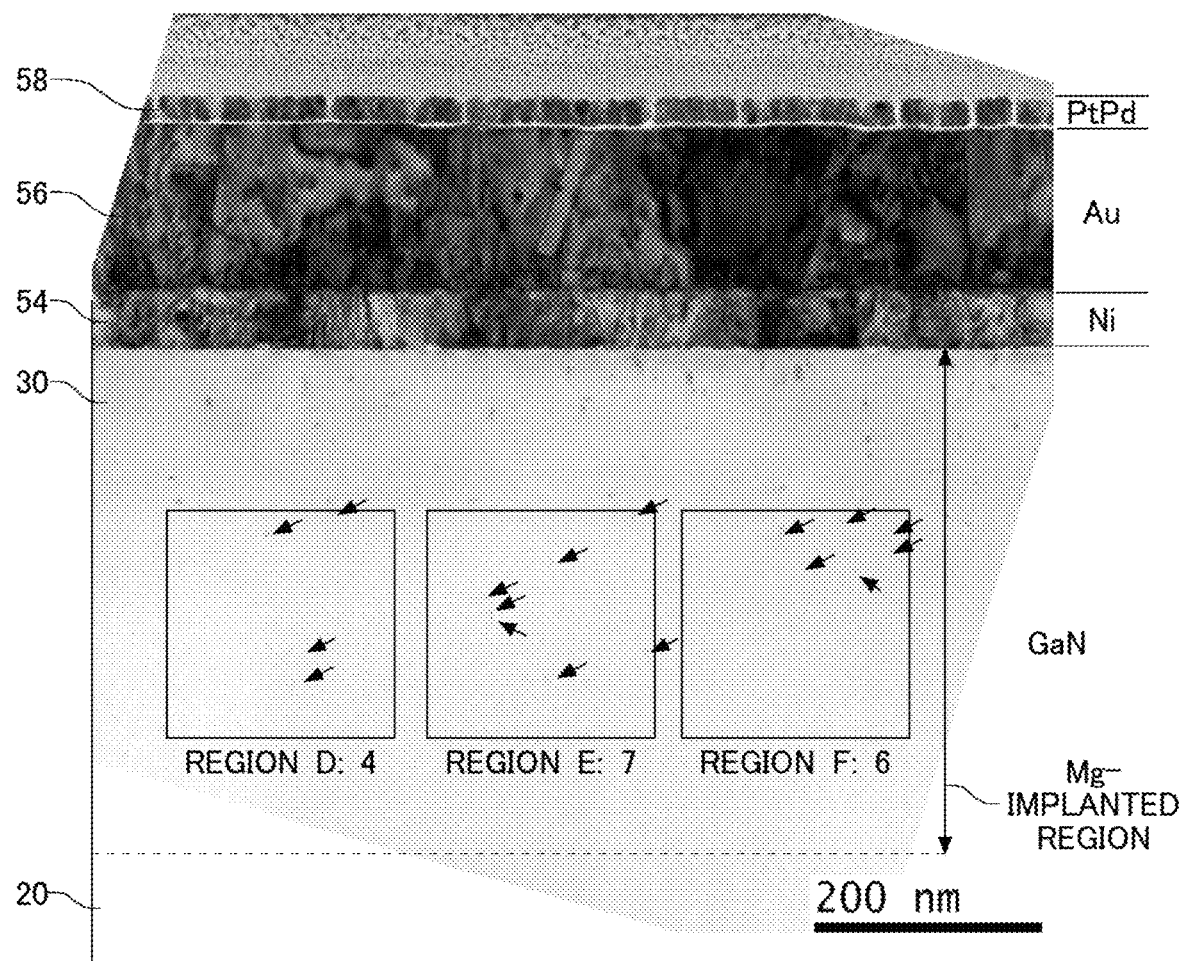
FIG. 7 is an exemplary cross-sectional TEM image illustrating the crystal defect density in an ion implantation layer 30.

FIG. 7 is an exemplary cross-sectional TEM image illustrating the crystal defect density in the ion implantation layer 30. The present example illustrates a cross-sectional TEM image of a region near a surface of the ion implantation layer 30. In one example, the observation conditions of the TEM image were: accelerating voltage=200 kV; observation magnification=×50,000; and observation direction=<11-20>. The region D to region F correspond to 200-nm square regions in a cross-section of the nitride semiconductor device 500. The region D to region F are different regions provided at the same depth.

The Ni layer 54 and Au layer 56 are stacked on the ion implantation layer 30. The PtPd layer 58 is a layer provided for making it sure that there is conductivity for TEM observation.

The region D has four crystal defects in the 200-nm square region. The region E has seven crystal defects in the 200-nm square region. The region F has six crystal defects in the 200-nm square region. In this manner, there are about four to seven crystal defects in each 200-nm square region in the present example. In this case, the nitride semiconductor device 100 has a crystal defect density equal to or lower than $1 \times 10^6$ $cm^{-3}$.

Figure 8:
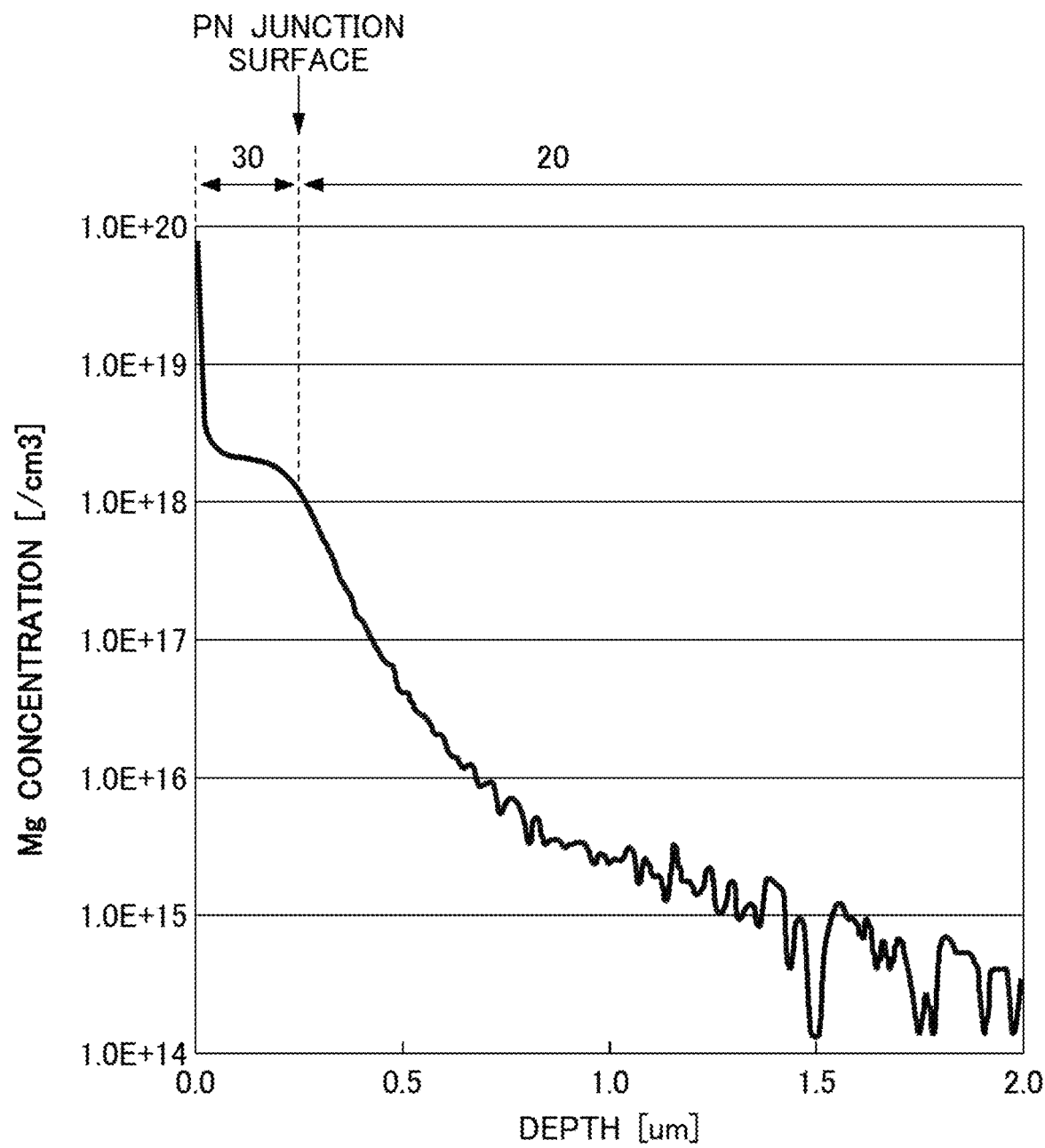
FIG. 8 illustrates a result of SIMS analysis performed on Mg in the ion implantation layer 30.

FIG. 8 illustrates a result of SIMS analysis performed on Mg in the ion implantation layer 30. Secondary Ion Mass Spectrometry (SIMS: Secondary Ion Mass Spectrometry) is a method of analyzing elements and concentrations thereof in a sample by detecting secondary ions generated along with sputtering. In the present example, the doping concentration of Mg at a surface of the ion implantation layer 30 is detected by SIMS.

The ion implantation layer 30 in the present example is formed by ion implantation performed using Mg as a dopant at multiple steps. Therefore, the ion implantation layer 30 has a region where the doping concentration is uniform in the depth direction. In the present specification, that a region has a uniform doping concentration in the depth direction means that, in the region, the difference in doping concentration between two positions that are 100 nm apart in the depth direction is a ten-fold difference or smaller. In this manner, by providing a region where the doping concentration is uniform in the depth direction, an ion implantation layer 30 with excellent P type characteristics and few crystal defects can be provided.

On the other hand, if an ion implantation layer is formed by ion implantation at a single step, it is difficult to make the doping concentration uniform in the depth direction. For example, if a P type dopant is ion-implanted at a single step, the peak of the doping concentration of the P type dopant is generated at a single location, and so it is not possible to ion-implant the P type dopant uniformly. Similarly, if a Group V element is ion-implanted at a single step, the peak of the doping concentration of the Group V element is generated at a single location, and so it is not possible to ion-implant the Group V element uniformly. Therefore, it is difficult to improve the P type characteristics, and lower the crystal defect density at the PN junction interface. In particular, it is difficult to make the peak position of the P type dopant the PN junction interface by ion implantation performed at a single step.

Figure 9:
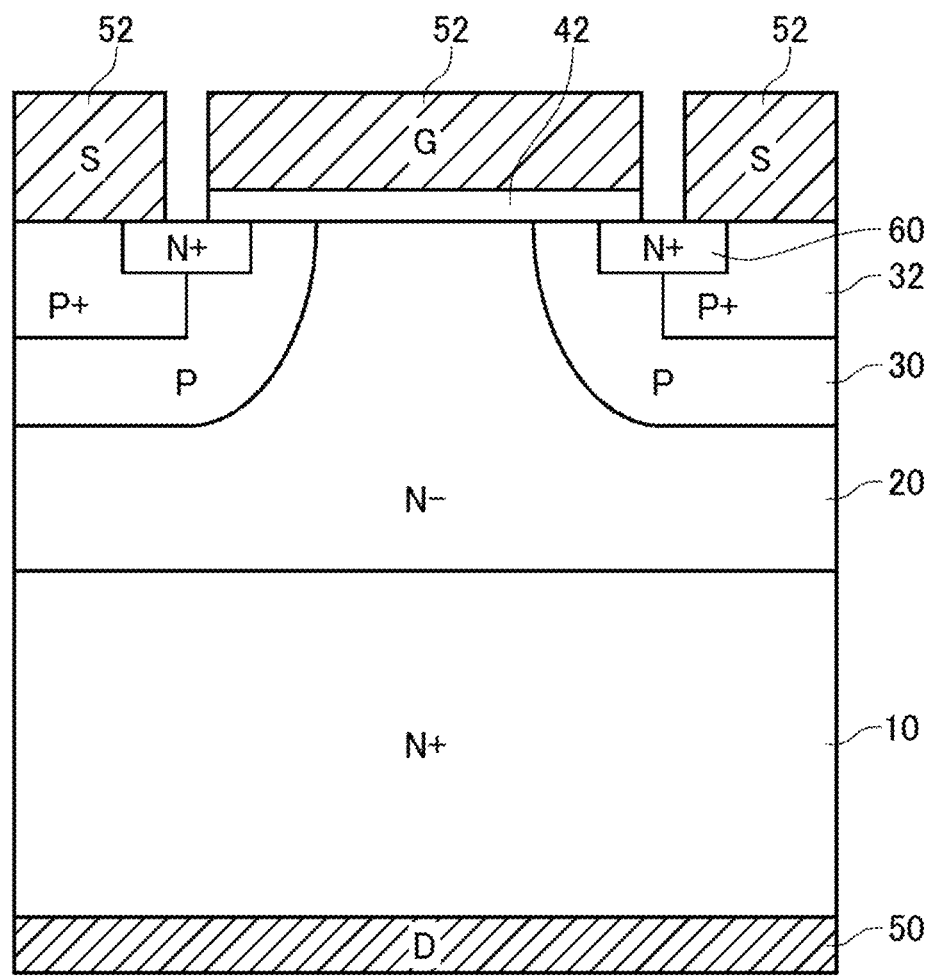
FIG. 9 illustrates an exemplary configuration of the nitride semiconductor device 100 according to a second embodiment.

FIG. 9 illustrates an exemplary configuration of the nitride semiconductor device 100 according to a second embodiment. The nitride semiconductor device 100 in the present example is a vertical GaN MOSFET. In particular, the nitride semiconductor device 100 in the present example is an exemplary vertical double-diffusion MOSFET (VD-MOSFET).

The upper-surface-side electrode 52 includes a source electrode S and a gate electrode G. A gate insulating film 42 is provided between a channel region above the epitaxial layer 20, and the gate electrode G. The lower surface-side electrode 50 is a drain electrode D.

The ion implantation layer 30 is a P type well region. That is, the P type well region of the nitride semiconductor device 100 in the present example is formed by a method similar to that for the ion implantation layer 30 illustrated in FIG. 1. That is, the ion implantation layer 30 in the present example may be provided by ion-implanting and annealing the P type dopant and the Group V element. Thereby, the crystal defect density in the P type well region is lowered. In addition, the P type dopant and Group V element may be ion-implanted at multiple steps. Using the P type well region of the vertical GaN MOSFET as the ion implantation layer 30 in this manner, a high-withstand-voltage device is obtained.

An ion implantation layer 32 is a P+ well region provided below the source electrode S. The ion implantation layer 32 may be provided by a process similar to that for the ion implantation layer 30. That is, the ion implantation layer 32 may be provided by ion-implanting and annealing the P type dopant and the Group V element. Thereby, the doping concentration of the ion implantation layer 32 can be increased, and the contact with the source electrode S can be improved. In addition, since the crystal defect density in the ion implantation layer 32 is lowered, the reliability improves.

A source region 60 is an N+ source region. The source region 60 is provided at the upper surface of the epitaxial layer 20, and between the gate electrode G and the source S. The source region 60 may be provided by ion implantation of an N type dopant. For example, the N type dopant is at least one of silicon and germanium.

In this manner, if the nitride semiconductor device 100 is a vertical GaN MOSFET, a high-withstand-voltage device can be provided using the ion implantation layer 30 and ion implantation layer 32 as the P type well region. In addition, the electrical characteristics of the nitride semiconductor device 100 improve.

Figure 10A:
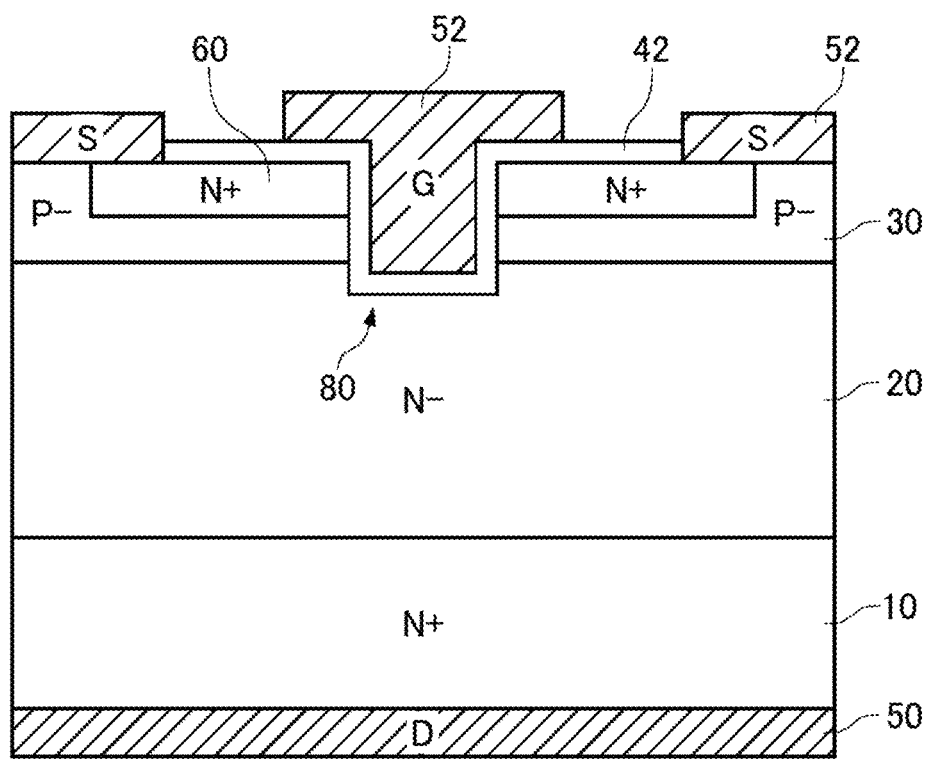
FIG. 10A illustrates an exemplary configuration of the nitride semiconductor device 100 according to a third embodiment.

FIG. 10A illustrates an exemplary configuration of the nitride semiconductor device 100 according to a third embodiment. The nitride semiconductor device 100 in the present example is a vertical GaN MOSFET. The nitride semiconductor device 100 in the present example has a gate trench 80.

The gate trench 80 is provided at the upper surface of the epitaxial layer 20. The inner wall of the gate trench 80 is provided with the gate insulating film 42. In addition, the gate electrode G of the upper-surface-side electrode 52 is provided on the gate insulating film 42. The upper surface of the epitaxial layer 20 is provided with the ion implantation layer 30 and source region 60.

The ion implantation layer 30 has a uniform depth. The ion implantation layer 30 in the present example is provided at a shallower position than the gate trench 80 is. That the ion implantation layer 30 is provided at a shallower position than the gate trench 80 is means that the lower end of the ion implantation layer 30 is provided above the lower end of the gate trench 80. Note that the nitride semiconductor device 100 in the present example corresponds to an example in which the ion implantation layer 30 is applied to a vertical GaN MOSFET, and the arrangement of the ion implantation layer 30 is not limited to the one illustrated in the present example.

Figure 10B:
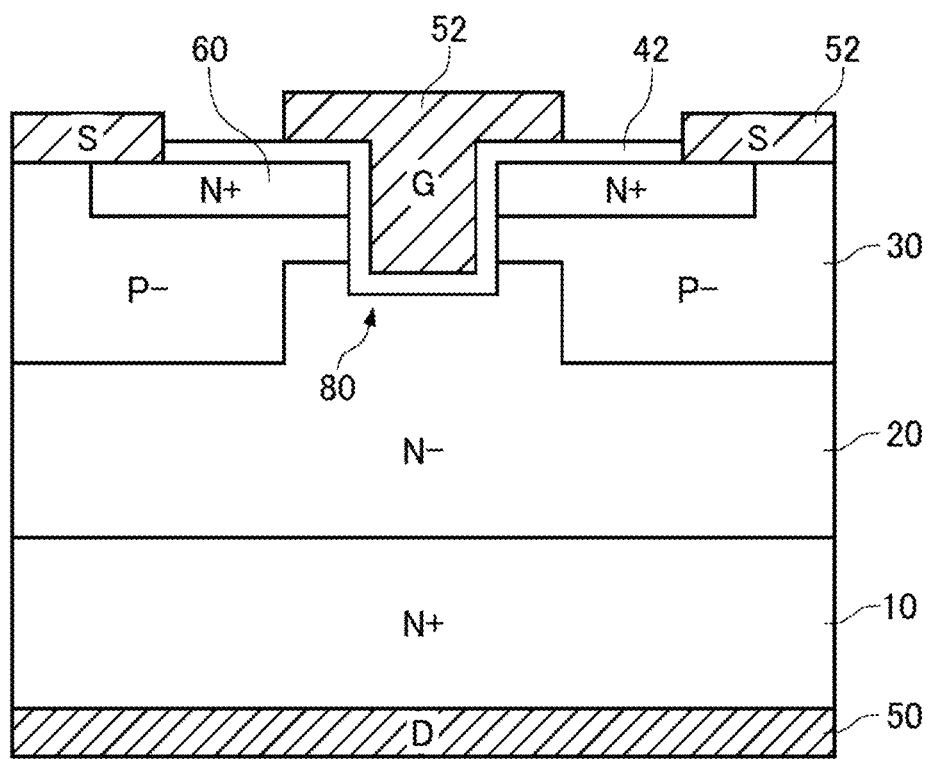
FIG. 10B illustrates another exemplary nitride semiconductor device 100 according to the third embodiment.

FIG. 10B illustrates another exemplary nitride semiconductor device 100 according to the third embodiment. The nitride semiconductor device 100 in the present example is a vertical GaN MOSFET. Differences from the nitride semiconductor device 100 in FIG. 10A are particularly explained in the present example.

The ion implantation layer 30 is different from the ion implantation layer 30 illustrated in FIG. 10A in terms of the region of ion implantation. Since ion implantation is performed selectively in the ion implantation layer 30 in the present example, depths can be changed region by region. For example, the ion implantation layer 30 has a region shallower than the gate trench 80, and a region deeper than the gate trench 80. In this manner, by providing regions with depths that are different region by region in the ion implantation layer 30, the characteristics of the nitride semiconductor device 100 can be optimized. The ion implantation layer 30 in the present example can effectively protect the gate insulating film 42, and improve the withstand voltage.

Note that the P type region provided to the nitride semiconductor device 100 in the present example is an exemplary application of the ion implantation layer 30, and may be changed as appropriate depending on the structure or characteristics of the nitride semiconductor device 100 to which it is applied. By combining ion implantation of the P type dopant and Group V element to form the ion implantation layer 30, it can be applied to nitride semiconductor devices 100 with a variety of structures. In particular, by implanting the P type dopant and Group V element at multiple steps, the crystal defect density can be lowered also in a region near the PN junction boundary while at the same time realizing excellent P type characteristics.

Figure 11A:
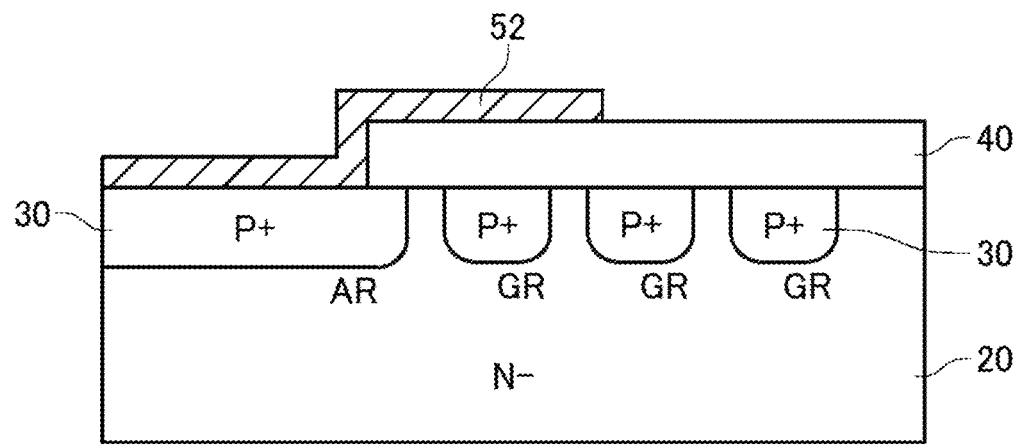
FIG. 11A illustrates an exemplary configuration of the nitride semiconductor device 100 according to a fourth embodiment.

FIG. 11A illustrates an exemplary configuration of the nitride semiconductor device 100 according to a fourth embodiment. The nitride semiconductor device 100 according to the fourth embodiment has the withstand voltage structure of the ion implantation layer 30. The nitride semiconductor device 100 in the present example is an exemplary vertical GaN power device having the ion implantation layer 30 as a P type region of a peripheral edge termination structure. The P type region of the peripheral edge termination structure means an active portion AR or a guard ring GR provided at the upper surface of the epitaxial layer 20.

The ion implantation layer 30 is formed at the upper surface of the epitaxial layer 20. The ion implantation layer 30 has an active portion AR and a plurality of guard rings GR at the upper surface of the epitaxial layer 20. A significant electrical field occurs at an end portion of the active portion AR as compared to other portions of the active portion AR. In addition, the guard rings GR relax the electrical field generated at the end portion of the active portion AR. Therefore, the end portion of the active portion AR or the guard ring GR are regions at the upper surface of the epitaxial layer 20 where a withstand voltage is required. With the nitride semiconductor device 100 in the present example, the withstand voltage of a peripheral edge termination structure can be improved by applying the ion implantation layer 30 to the active portion AR and the plurality of guard rings GR.

Figure 11B:
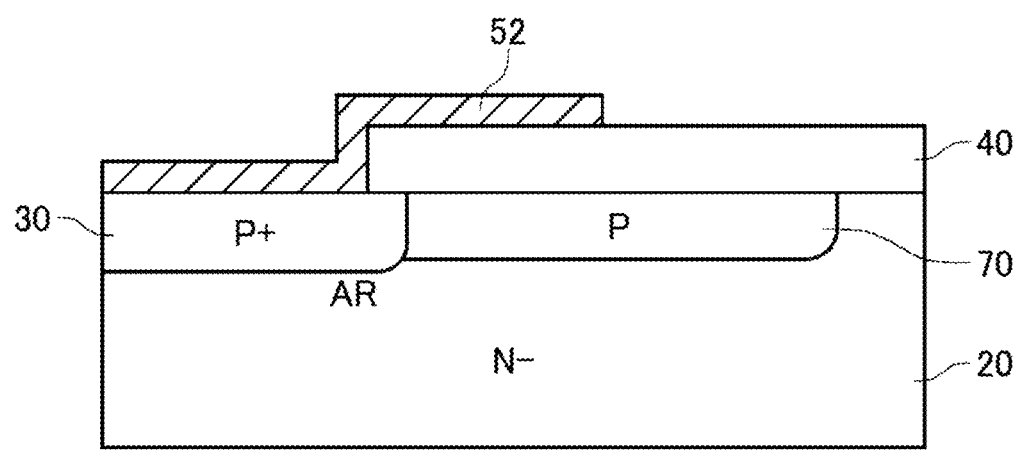
FIG. 11B illustrates another exemplary nitride semiconductor device 100 according to the fourth embodiment.

FIG. 11B illustrates another exemplary nitride semiconductor device 100 according to the fourth embodiment. The ion implantation layer 30 in the present example has a junction termination extension (JTE: Junction Termination Extension) structure.

The ion implantation layer 30 is formed at the upper surface of the epitaxial layer 20. The ion implantation layer 30 constitutes an active portion AR at the upper surface of the epitaxial layer 20. With the nitride semiconductor device 100 in the present example, the withstand voltage can be improved by applying the ion implantation layer 30 to the active portion AR.

An ion implantation layer 70 is an exemplary P type well region provided at the upper surface of the epitaxial layer 20. The ion implantation layer 70 is formed by a method similar to that for the ion implantation layer 30 illustrated in FIG. 1. That is, the ion implantation layer 30 may be provided by ion-implanting and annealing the P type dopant and the Group V element. Thereby, the crystal defect density in the P type well region is lowered. In addition, the P type dopant and Group V element may be ion-implanted at multiple steps. In the present example, the withstand voltage of the ion implantation layer 70 improves, and the withstand voltage of the junction termination extension structure can be improved.

In this manner, with the nitride semiconductor device 100, the ion implantation layer 30 can be applied to P type regions of various structures such as diodes, MOSFETs, or peripheral edge termination structures. Thereby, the withstand voltage of the PN junction provided to the nitride semiconductor device 100 improves.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A nitride semiconductor device comprising:
an epitaxial layer;
an ion implantation layer that is provided on the epitaxial layer over a continuous depth range that extends over 100 nm or longer, and has a P type doping concentration equal to or higher than $1\times10^{17}$ cm$^{-3}$; and
a Group V element implanted in the ion implantation layer to cover a range in which P type dopant is implanted, wherein
the ion implantation layer has a region with a crystal defect density equal to or lower than $1\times10^{16}$ cm$^{-3}$, the region being located in a range which is on an upper-surface-side of an interface between the epitaxial layer and the ion implantation layer, and is within 100 nm from the interface.

2. The nitride semiconductor device according to claim 1, wherein the P type doping concentration of the ion implantation layer is equal to or higher than $1\times10^{18}$ cm$^{-3}$.

3. The nitride semiconductor device according to claim 1, wherein the ion implantation layer has a region with a crystal defect density equal to or lower than $1\times10^{15}$ cm$^{-3}$, the region being located in the range which is on the upper-surface-side of the interface between the epitaxial layer and the ion implantation layer, and is within 100 nm from the interface.

4. The nitride semiconductor device according to claim 1, wherein the ion implantation layer has a region where a doping concentration of a P type dopant is uniform in a depth direction.

5. The nitride semiconductor device according to claim 1, wherein
the epitaxial layer is of N type, and
the nitride semiconductor device comprises a PN junction having the epitaxial layer as an N type region and the ion implantation layer as a P type region.

6. The nitride semiconductor device according to claim 5, wherein a withstand voltage of the PN junction is equal to or higher than 600 V.

7. The nitride semiconductor device according to claim 1, wherein the nitride semiconductor device is a PN diode having the ion implantation layer as a P type region of the PN diode.

8. The nitride semiconductor device according to claim 1, wherein the nitride semiconductor device is a vertical GaN MOSFET having the ion implantation layer as a P type well region.

9. The nitride semiconductor device according to claim 1, wherein the nitride semiconductor device is a vertical GaN power device having the ion implantation layer as a P type region of a peripheral edge termination structure.

10. A nitride semiconductor device fabrication method comprising:
forming an epitaxial layer;
forming an ion implantation layer that is provided on the epitaxial layer over a continuous depth range that extends over 100 nm or longer, and has a P type doping concentration equal to or higher than $1\times10^{17}$ cm$^{-3}$;
implanting a Group V element to cover a range in which P type dopant is implanted, wherein
the ion implantation layer has a region with a crystal defect density equal to or lower than $1\times10^{16}$ cm$^{-3}$, the region being located in a range which is on the upper-surface-side of an interface between the epitaxial layer and the ion implantation layer, and is within 100 nm from the interface.

11. The nitride semiconductor device fabrication method according to claim 10, wherein
the forming the ion implantation layer has:
ion-implanting the P type dopant at multiple steps; and
ion-implanting the Group V element at multiple steps.

12. The nitride semiconductor device fabrication method according to claim 10, wherein the forming the ion implantation layer has ion-implanting at least one of Mg, Ca, Zn, and Be.

* * * * *